(12) United States Patent
Eissa et al.

(10) Patent No.: US 7,354,853 B2
(45) Date of Patent: Apr. 8, 2008

(54) SELECTIVE DRY ETCHING OF TANTALUM AND TANTALUM NITRIDE

(75) Inventors: Mona M. Eissa, Plano, TX (US); Troy A. Yocum, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 322 days.

(21) Appl. No.: 11/179,316

(22) Filed: Jul. 12, 2005

(65) Prior Publication Data
US 2005/0250337 A1 Nov. 10, 2005

Related U.S. Application Data

(62) Division of application No. 10/253,791, filed on Sep. 23, 2002, now Pat. No. 6,939,795.

(51) Int. Cl.
*H01L 21/4763* (2006.01)
(52) U.S. Cl. ............... 438/626; 438/627; 438/629; 438/643; 438/648; 438/653; 438/656; 438/685; 438/687; 438/710; 438/720
(58) Field of Classification Search ........ 438/622–629, 438/642–645, 648, 652–654, 656, 658, 762–763, 438/768, 773, 775, 785, 710, 720; 257/E21.49, 257/E21.308, E21.246, E21.249
See application file for complete search history.

(56) References Cited

U.S. PATENT DOCUMENTS

| | | | |
|---|---|---|---|
| 5,098,860 A * | 3/1992 | Chakravorty et al. | ........ 438/628 |
| 6,086,777 A | 7/2000 | Cheng et al. | |
| 6,331,380 B1 | 12/2001 | Ye et al. | |
| 6,429,128 B1 * | 8/2002 | Besser et al. | ........ 438/687 |
| 6,984,585 B2 * | 1/2006 | Ying et al. | ........ 438/689 |
| 2002/0175419 A1 | 11/2002 | Wang et al. | |

FOREIGN PATENT DOCUMENTS

EP 1 156 133 A2 11/2001

* cited by examiner

*Primary Examiner*—Kimberly D. Nguyen
*Assistant Examiner*—Chakila D Tillie
(74) *Attorney, Agent, or Firm*—W. James Brady, III; Frederick J. Telecky, Jr.

(57) ABSTRACT

The invention describes a method for the selective dry etching of tantalum and tantalum nitride films. Tantalum nitride layers (30) are often used in semiconductor manufacturing. The semiconductor substrate is exposed to a reducing plasma chemistry which passivates any exposed copper (40). The tantalum or tantalum nitride films are selectively removed using an oxidizing plasma chemistry.

8 Claims, 1 Drawing Sheet

SELECTIVE DRY ETCHING OF TANTALUM AND TANTALUM NITRIDE

This application is a divisional of application Ser. No. 10/253,791, filed Sep. 23, 2002 now U.S. Pat. No. 6,939,795.

FIELD OF THE INVENTION

The present invention relates to a dry etching process for the selective removal of tantalum and tantalum nitride layers. The dry etch process used etches tantalum and tantalum nitride without significantly attacking copper layers and silicon oxide based dielectric layers.

BACKGROUND OF THE INVENTION

The use of copper for forming the metal interconnect lines in integrated circuits is finding increasing usage due to the superior properties of copper compared to the widely used aluminum lines. One of the primary challenges in integrated circuit fabrication is reducing the RC time delay. An important component of the RC time delay is the resistance and the capacitance present in the metal lines that connect the various devices that comprise the integrated circuit. The resistivity of copper is $1.72 \times 10^{-6}$ Ohm-cm versus that of aluminum which is $2.82 \times 10^{-6}$ Ohm-cm. This reduced resistivity will reduce the RC delay associated with copper lines. In addition copper has superior resistance to electromigration and higher reliability when compared to commonly used aluminum alloys.

In general integrated circuit metal lines are formed in dielectric layers. These dielectric layers typically comprise silicon oxide or contain silicon oxide. In a typical damascene process for forming an integrated circuit copper line a trench is first formed in a dielectric layer which is formed over a silicon substrate containing electronic devices such as transistors, diodes, etc. This is illustrated in FIG. 1 where the dielectric layer 10 is formed over a silicon substrate. Using standard silicon processing technology a trench 20 is formed in the dielectric layer 10. Because copper reacts with silicon oxide, it is necessary to confine it using a baffler layer. A commonly used barrier layer is tantalum nitride ($Ta_xN_y$) which is formed on the dielectric layer before the formation of the copper layer. A $Ta_xN_y$ barrier layer 30, 35 is shown in FIG. 1. The $Ta_xN_y$ is formed in a blanket deposition resulting in regions 35 which line the trench and region 30 which forms on the surface on the dielectric layer 10 outside the trench. Following the formation of the $Ta_xN_y$ barrier layer a thick layer of copper is formed. Using standard processing techniques such as chemical mechanical processing (CMP) the excess copper is removed leaving that portion of copper 40 which forms in the trench. To complete the process the portions of the barrier layer which are not covered by copper (i.e. regions 30 in FIG. 1) must be removed. Using existing methods the selective removal of the $Ta_xN_y$ layer is a very difficult process. CMP processes are often used to remove the exposed $Ta_xN_y$ layer 30 but this often results in dishing of the exposed copper surface an erosion of the underlying dielectric layer 10. Wet chemical etching of the exposed $Ta_xN_y$ layer is difficult because most of the chemical solutions which etch $Ta_xN_y$ will attack the underlying dielectric material and etch or damage the exposed copper surfaces. A method is therefore needed to selectively etch $Ta_xN_y$ layers without damaging the underlying dielectric layer and/or the exposed copper surface.

SUMMARY OF INVENTION

Tantalum and tantalum nitride layers are often formed during integrated circuit formation. The instant invention recites a method to selectively etch tantalum nitride. The instant invention comprises exposing a semiconductor substrate comprising at least one tantalum layer and/or tantalum nitride layer to reducing plasma chemistry where this reducing chemistry passivates any exposed copper or dielectric layers exposed to the reducing chemistry. All or a portion of the tantalum and/or tantalum nitride layers can then be selectively removed by exposing the semiconductor substrate to an oxidizing plasma chemistry.

DETAILED DESCRIPTION OF THE INVENTION

A two step dry etch process is used to selectively etch $Ta_xN_y$ and/or Tantalum (Ta). The subscripts x and y in the chemical symbol for tantalum nitride (i.e. $Ta_xN_y$) represent integer numbers that depend on the form of the tantalum nitride alloy. The etch process of the instant invention will selectively etch all forms of tantalum nitride as well as tantalum metal. The process conditions are described in the following table:

| Indices | Units | Reducing Step 1 | Oxidizing Step 2 |
|---|---|---|---|
| Wafer Temperature | Celsius | >60 | <100 |
| Pressure | milliTorr | 500-900 | 500-900 |
| $N_2$ | Sccm | 250-1000 | 0 |
| $NH_3$ | Sccm | 1000-4000 | 0 |
| $O_2$ | Sccm | 0 | 1000-5000 |
| $H_2$ | Sccm | 0 | 0 |
| $C_2F_4$ | Sccm | 0 | 20-100 |
| Power | Watts | 700-1200 | 800-1800 |

Figure 1:
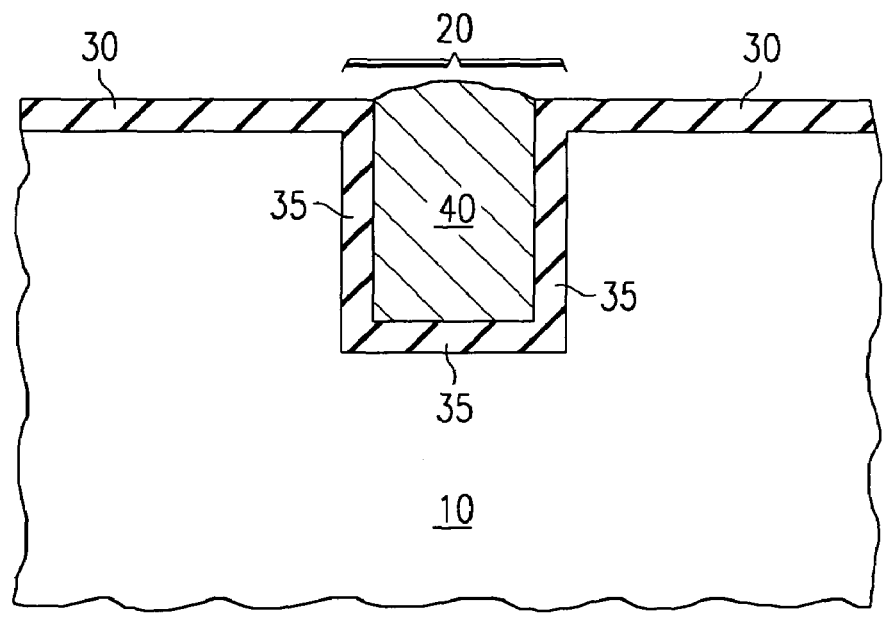
FIG. 1 is a cross section diagram illustrating a tantalum nitride barrier layer beneath a copper region.

As shown in above table, the first step of the process comprises a plasma process with nitrogen ($N_2$) and ammonium ($NH_3$) as the active gases. In addition to $N_2$ and $NH_3$ other gases, including carrier gases such as argon, can be present in the chamber without departing from the instant invention. In an embodiment of the instant invention the flow rates of $N_2$ and $NH_3$ are preferably 480 Sccm and 2200 Sccm respectively, the power 900 Watts, and the wafer temperature approximately 250° C. This step modifies the surfaces of the $Ta_xN_y$ and/or Ta layers by exposing the surfaces to a reducing plasma chemistry. In addition to modifying the surface of the $Ta_xN_y$ and/or Ta, the first step of the process passivates the copper surfaces exposed to the first step (e.g. 40 in FIG. 1) thereby reducing the oxidation rate of the copper surface. Therefore the first step of the etch process simultaneously modifies the surface of the $Ta_xN_y$ and/or Ta layers and passivates the exposed copper surfaces reducing the oxidation rate of the copper surface.

Figure 2:
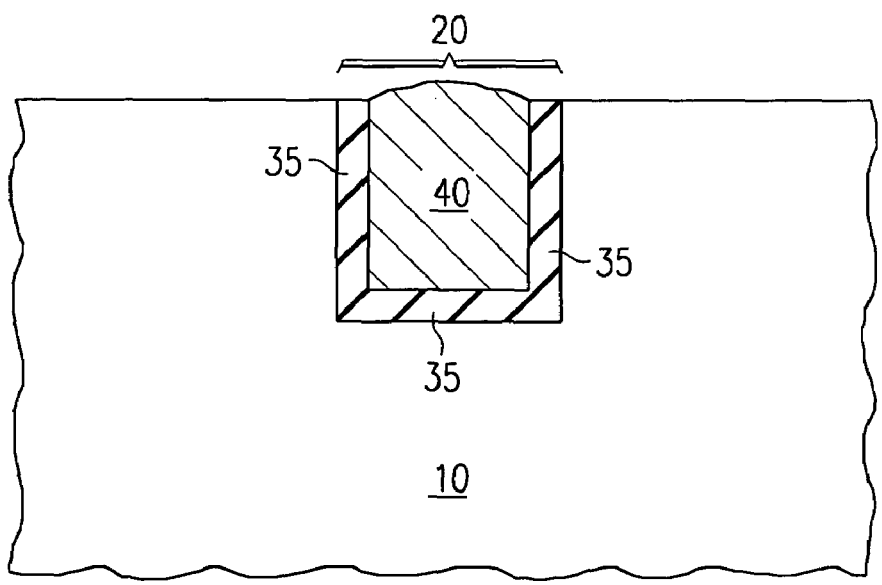
FIG. 2 is a cross section diagram showing the removal of a tantalum nitride layer.

The second step of the process comprises a plasma process with oxygen ($O_2$) and tetrafluoroethylene ($C_2F_4$) as the active gases. In addition to $O_2$ and $C_2F_4$ other gases can be present in the chamber without departing from the instant invention. In an embodiment of the instant invention the flow rates of $O_2$ and $C_2F_4$ are preferably 2900 Sccm and 60 Sccm respectively, the power 1200 Watts, and the wafer temperature approximately 60° C. This step uses an oxidizing plasma chemistry to remove the modified $Ta_xN_y$ and/or Ta layer without significantly attacking the dielectric layer. In addition the passivated copper surface from step one will be highly resistant to the oxidizing chemistry of the second step and therefore will not be significantly attacked during step two of the process. The two step etch process of the instant invention therefore results in a selective process for etching (or removing) $Ta_xN_y$ and/or Ta layers without attacking any underlying dielectric layers or exposed copper surfaces as shown in FIG. 2.

The above described two step etch process can be performed in the same plasma chamber or may be performed in separate chambers. In addition to etching the $Ta_xN_y$ and/or Ta barrier layers in copper metallization process, the process of the instant invention can be used to etch $Ta_xN_y$ and/or Ta layers and films in any application.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims any such modifications or embodiments.

We claim:

1. A method to selectively etch tantalum, comprising:
   providing a semiconductor substrate comprising at least one tantalum layer;
   exposing said tantalum layer to a reducing plasma chemistry comprising nitrogen and ammonium wherein said reducing chemistry passivates exposed copper surfaces; and
   exposing said tantalum layer to an oxidizing plasma chemistry selectively removing all or a portion of said tantalum layer.

2. The method of claim 1 wherein said oxidizing plasma chemistry comprises oxygen and tetrafluoroethylene.

3. The method claim 2 wherein said gas flow rates of oxygen and tetrafluoroethylene are 1000 Sccm to 5000 Sccm and 20 Sccm to 100 Sccm respectively.

4. The method of claim 3 wherein said plasma power of said oxidizing plasma chemistry is 800 Watts to 1800 Watts.

5. The method of claim 4 wherein temperature of said tantalum layer is less than one hundred degrees centigrade during said exposing of said tantalum layer to said oxidizing plasma chemistry.

6. The method of claim 1 wherein gas flow rates of nitrogen and ammonium are 250 Sccm to 1000 Sccm and 1000 Sccm to 4000 Sccm respectively.

7. The method of claim 6 wherein plasma power of said reducing plasma chemistry is 700 Watts to 1200 Watts.

8. The method of claim 7 wherein temperature of said tantalum layer is greater than sixty degrees centigrade during said exposing of said tantalum layer to said reducing plasma chemistry.

* * * * *